(12) United States Patent
Woolard

(10) Patent No.: US 10,811,855 B2
(45) Date of Patent: *Oct. 20, 2020

(54) COOLING SYSTEM FOR TANKS

(71) Applicant: EATON INTELLIGENT POWER LIMITED, Dublin (IE)

(72) Inventor: David G. Woolard, Mauldin, SC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/687,004

(22) Filed: Nov. 18, 2019

(65) Prior Publication Data

US 2020/0091687 A1    Mar. 19, 2020

Related U.S. Application Data

(63) Continuation of application No. 15/694,319, filed on Sep. 1, 2017, now Pat. No. 10,483,727.

(51) Int. Cl.
*H02B 1/56* (2006.01)
*H01F 27/18* (2006.01)
(Continued)

(52) U.S. Cl.
CPC ........... *H02B 1/56* (2013.01); *F28D 15/0266* (2013.01); *F28D 15/043* (2013.01);
(Continued)

(58) Field of Classification Search
CPC ... H01L 23/427; H01L 23/467; H01L 23/473; F28D 15/0266; F28D 15/0275;
(Continued)

(56) References Cited

U.S. PATENT DOCUMENTS 2,271,972 A    2/1942    Engel
5,091,819 A    2/1992    Christiansen
(Continued)

FOREIGN PATENT DOCUMENTS

DE    19612565 A1    10/1997
EP    142797 B1    4/2006
(Continued)

OTHER PUBLICATIONS

International Search Report and Written Opinion; corresponding PTC Application No. PCT/EP2018/073544; filed Aug. 31, 2018; dated Dec. 11, 2018.
DE 19612565 A1 English Translation of Fritz.

* cited by examiner

*Primary Examiner* — Mandeep S Buttar
(74) *Attorney, Agent, or Firm* — Squire Patton Boggs (US) LLP

(57) ABSTRACT

A tank assembly has heat-generating equipment contained therein. The tank assembly includes a heat pipe having an opening, wherein an interior of the heat pipe contains a liquid and a gas. The tank assembly further includes a tank fixed to the heat pipe and sealing the opening of the heat pipe. The tank houses at least one of a disconnector switch and a circuit breaker operatively connected to the disconnector switch. The sealing of the opening of the heat pipe prevents the liquid and the gas from entering the tank. The heat pipe extends beyond a side of the tank, and has a cooling portion.

20 Claims, 8 Drawing Sheets

(51) Int. Cl.
*H01F 27/10* (2006.01)
*H05K 7/20* (2006.01)
*F28D 15/04* (2006.01)
*H01F 27/02* (2006.01)
*F28D 15/02* (2006.01)
*H02B 13/045* (2006.01)

(52) U.S. Cl.
CPC .......... *H01F 27/025* (2013.01); *H01F 27/10* (2013.01); *H01F 27/18* (2013.01); *H05K 7/203* (2013.01); *H05K 7/2069* (2013.01); *H02B 13/045* (2013.01)

(58) Field of Classification Search
CPC ............ F28D 1/0213; F28D 1/0246; F28D 2020/0082; F28D 2020/0086; F28D 2021/0029; F28D 2021/0031; F28D 9/005; F17C 2223/046; F17C 2227/0323; H02B 1/56; H05K 7/20818; H05K 7/20327; B23P 19/00
USPC ............ 361/678, 699, 700, 701; 165/104.21, 165/104.26, 104.33, 80.4, 157, 164; 324/318
See application file for complete search history.

(56) References Cited

U.S. PATENT DOCUMENTS

| | | | |
|---|---|---|---|
| 5,613,552 | A | 3/1997 | Osakabe |
| 5,871,043 | A | 2/1999 | Osakabe |
| 6,005,772 | A | 12/1999 | Terao et al. |
| 2002/0012225 | A1* | 1/2002 | Matsushita ............ H02B 5/06 361/605 |
| 2003/0019612 | A1 | 1/2003 | Osakabe |
| 2004/0037025 | A1 | 2/2004 | Abe |
| 2011/0048676 | A1 | 3/2011 | Toyoda |
| 2011/0088940 | A1 | 4/2011 | Nordling |
| 2011/0214840 | A1 | 9/2011 | Sakamoto |
| 2012/0204590 | A1 | 8/2012 | Frigiere |
| 2015/0027987 | A1 | 1/2015 | Senne |
| 2015/0354902 | A1 | 12/2015 | McDonald |
| 2016/0192540 | A1 | 6/2016 | Riedel |

FOREIGN PATENT DOCUMENTS

| | | |
|---|---|---|
| EP | 2444768 | 4/2012 |
| EP | 2715891 | 8/2018 |
| WO | 2014071985 | 5/2014 |
| WO | 2015056288 | 4/2015 |

COOLING SYSTEM FOR TANKS

CROSS REFERENCE TO RELATED APPLICATION

This application is a continuation of U.S. patent application Ser. No. 15/694,319, filed on Sep. 1, 2017, the disclosure of which is incorporated by reference herein in its entirety.

FIELD OF INVENTION

This disclosure relates to cooling systems for tanks in medium voltage switchgear assemblies. More particularly, this disclosure relates to cooling systems for gas-insulated tanks utilizing thermal heat transfer to a peripheral apparatus.

BACKGROUND

Insulated tanks are used in the power distribution and control industry to house and insulate electronic equipment, such as circuit breakers, switches, transformers, servers, or circuit boards. These tanks can be filled with a gas or dielectric liquid that environmentally and/or electrically insulates the equipment from the environment outside of the tank.

Because these tanks are not open to the outside environment, removing heat generated by the electronic equipment can pose a problem. Finned heat sinks can be applied to the surface of the tank to dissipate heat, but they are limited by the airflow near the surface of the tank. Further, attaching a heat sink or other passive cooling device directly to the tank adds an additional thermal barrier between the cooling device and tank wall, impeding heat transfer.

SUMMARY

In one embodiment, a tank assembly has heat-generating equipment contained therein. The tank assembly includes a thermal siphon having an opening and a closed tank fixed to the thermal siphon such that a side of the tank seals the opening of the thermal siphon. The thermal siphon contains a liquid and a gas, and has a cooling portion. The tank includes a first tank and a second tank, wherein the first tank houses a disconnector switch, and the second tank houses a circuit breaker operatively connected to the disconnector switch.

In another embodiment, a tank assembly has heat-generating equipment contained therein. The tank assembly includes a thermal siphon having an opening, wherein an interior of the thermal siphon contains a liquid and a gas. The tank assembly further includes a tank fixed to the thermal siphon and sealing the opening of the thermal siphon. The tank houses at least one of a disconnector switch and a circuit breaker operatively connected to the disconnector switch. The sealing of the opening of the thermal siphon prevents the liquid and the gas from entering the tank. The thermal siphon extends beyond a side of the tank, and has a cooling portion.

In another embodiment, a tank assembly has heat-generating equipment contained therein. The tank assembly includes a thermal siphon having an opening, wherein an interior of the thermal siphon contains a liquid and a gas. The tank assembly further includes a tank fixed to the thermal siphon and sealing the opening of the thermal siphon. The tank houses at least one of a disconnector switch and a circuit breaker operatively connected to the disconnector switch. The sealing of the opening of the thermal siphon prevents the liquid and the gas from entering the tank. The thermal siphon has a cooling portion that includes electrically insulated walls.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
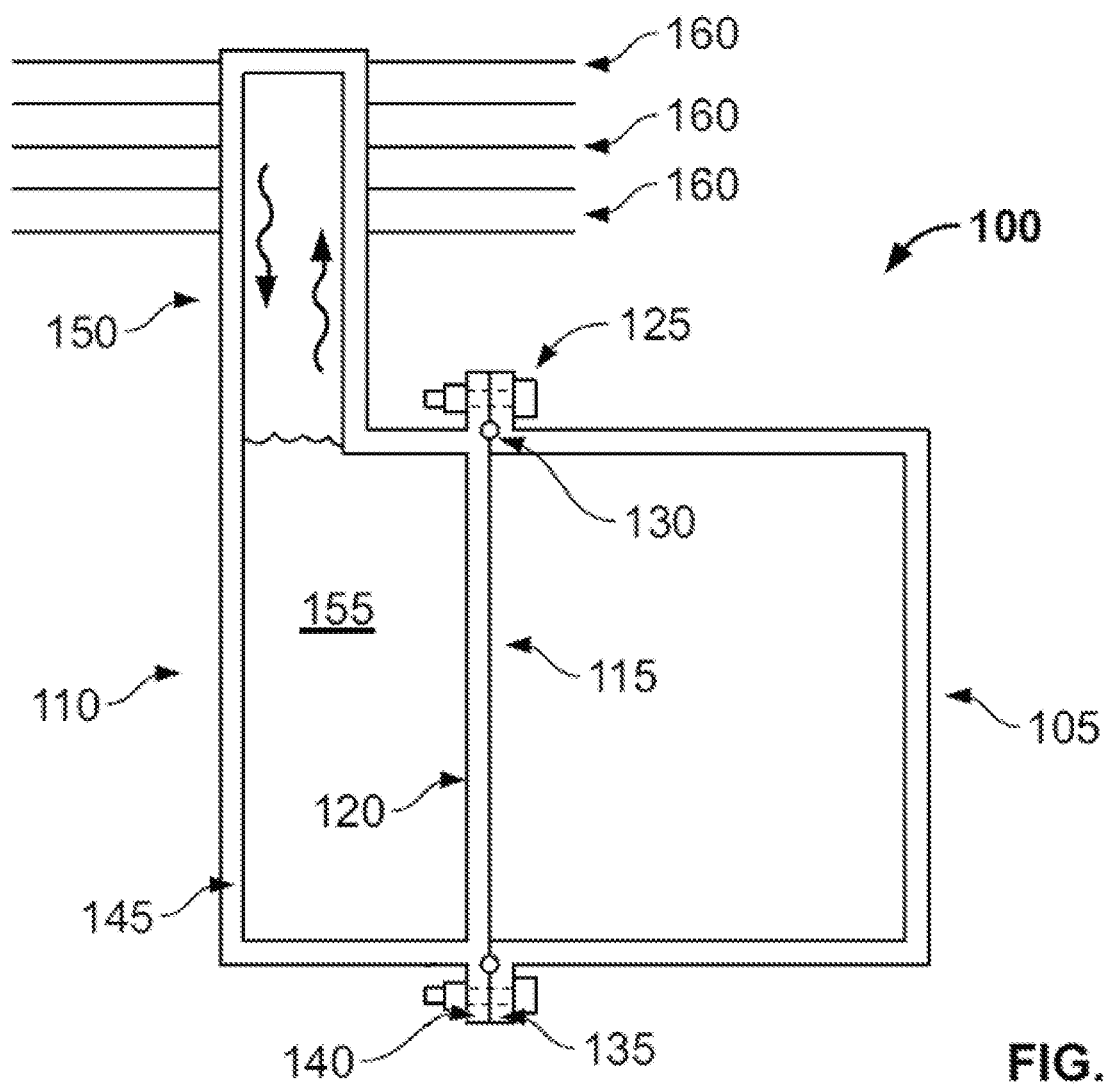
FIG. 1 is one embodiment of a thermal siphon bolted to a tank.

FIG. 1 shows an embodiment of a heat management system (or cooling system) 100 including a tank 105 and a thermal siphon 110. The heat management system 100 is designed to be installed in a larger housing that includes other electronic equipment for regulating and distributing power. The tank 105 can be adapted to contain medium or higher voltage electrical components for large industrial plants, power substations, or similar applications. For example, tank 105 and thermal siphon 110 could be components of a gas-insulated medium voltage switchgear assembly, and tank 105 could contain a circuit breaker for connection to a power source or load. The electrical components could alternatively include but are not limited to circuit breakers, switches, transformers, servers, circuit boards, etc. An exemplary voltage for such electrical components can be between 5,000 V to 40,000 V. In other embodiments, the voltage may be less than 5,000 V. The tank can further include an insulating fluid, such as a gas or a non-conductive oil. The insulating fluid insulates the electrical components from the outside environment, and prevents electrical conduction between the electrical components and the environment outside of the tank 105. The insulating fluid further absorbs heat generated by the electrical components.

The tank in this embodiment is depicted as generally rectangular in cross section, but can take other forms as well, such as a circular or trapezoidal form for example.

In the embodiment of FIG. 1, the tank 105 includes an opening 115 that is located adjacent to thermal siphon 110.

In this embodiment, tank 105 has no side wall where opening 115 is located: opening 115 extends from a top to a bottom of tank 105, and from a front to back of tank 105. The opening permits the insulating fluid within the tank to contact a conductive wall 120 of thermal siphon 110. This arrangement permits convective heat transfer from the insulating fluid within the tank directly to the conductive wall 120 of thermal siphon 110. The term "conductive" as used with respect to conductive wall 120 (and other embodiments of the "conductive wall") refers to thermal conduction, unless otherwise indicated. In alternative embodiments (not shown), opening 115 may be a partial opening in one side of tank 105.

The tank 105 is fixed to and sealed with the thermal siphon 110 via one or more bolts 125 and gaskets 130 located on flanges 135, 140 of the tank 105 and thermal siphon 110, respectively. The gasket 130 is placed between flanges 135, 140 and provides an airtight seal between the interior tank 105 and the outside environment. In this embodiment, flanges 135, 140 each extend around the perimeters of the tank 105 and thermal siphon 110, respectively. In alternative embodiments (not shown), multiple corresponding flanges could extend from the tank and thermal siphon. Other sealing arrangements may alternatively be utilized, as discussed below with respect to FIG. 2.

The thermal siphon 110 includes a main body (or reservoir) 145 and a cooling portion 150. Cooling portion 150 in this embodiment extends above reservoir 145 and takes the form of a hollow rectangular extension. In alternative embodiments (not shown), the cooling portion can take other forms, such as a cylindrical shape or an irregular shape for example.

The thermal siphon 110 in this embodiment is completely sealed from the outside environment. The main body 145 contains a liquid 155 that is suitable for drawing heat from the conductive wall 120. Eventually, the liquid 155 is heated to its boiling or vaporization point, and the resulting vapor rises up and into the cooling portion 150, as indicated by the wavy arrows in FIG. 1.

The liquid 155 can be any liquid suitable for effecting heat transfer with the conductive wall 120. For example, the liquid 155 can be water, a refrigerant such as R134a (also known at 1,1,1,2-Tetrafluoroethane) or Freon, or a dielectric refrigerant. The conductive wall 120 can be made from a highly conductive material, such as copper, aluminum, or other conductive materials.

Because the tank 105 has an opening 115 rather than a wall, heat is more effectively transferred from the tank 105 to the liquid 155 of thermal siphon 110, and the need for thermal conductive grease or other heat transfer aids may be eliminated.

The cooling section 150 further includes one or more fins 160 extending outwardly from the cooling section 150. The fins 160 are distal from both the thermal siphon main body 145 and tank 105. In this embodiment, the fins 160 extend outward from the cooling section 150 perpendicular to the cooling section 150. Fins 160 are affixed to the cooling section 150 to effect heat transfer between the vaporized liquid and outside environment. To facilitate this heat transfer, the walls of the cooling section 150 can be made from a highly conductive material, such as copper or aluminum, for example. The fins 160 can likewise be made of a highly conductive material such as copper or aluminum. The heat from fins 160 is dissipated to the outside environment, removing the heat from the heat management system. One or more fans (not shown) or other devices may be employed to force air between fins 160, further facilitating the heat removal. Once the liquid vapor in cooling portion 150 loses heat via thermal conduction through the walls of the cooling portion 150 to fins 160, liquid vapor condenses and falls back into main body 145 of thermal siphon 110. This cooling cycle repeats to continuously remove heat from the tank 105.

Fins 160 can take the form of flat circular flanges, or can take other shapes that facilitate heat transfer to the environment, for example flat rectangular flanges. Any number of fins 160 may be included on cooling portion 150. In alternative embodiments (not shown), fins can be located elsewhere on either the tank 105 or thermal siphon 110.

In the illustrated embodiment, a single thermal siphon 110 is attached to the tank 105, but in alternative embodiments (not shown), any number of thermal siphons may be affixed to the tank 105 to further improve heat removal. In other alternative embodiments (not shown), the tank may have a plurality of openings, with each of those openings having a corresponding thermal siphon. In other alternative embodiments (not shown), the tank may have multiple openings corresponding to a single siphon. In other alternative embodiments (not shown), multiple siphons may correspond to a single opening in the tank. In alternative embodiments (not shown), each thermal siphon can include a plurality of cooling portions each having a fin stack.

Figure 2:
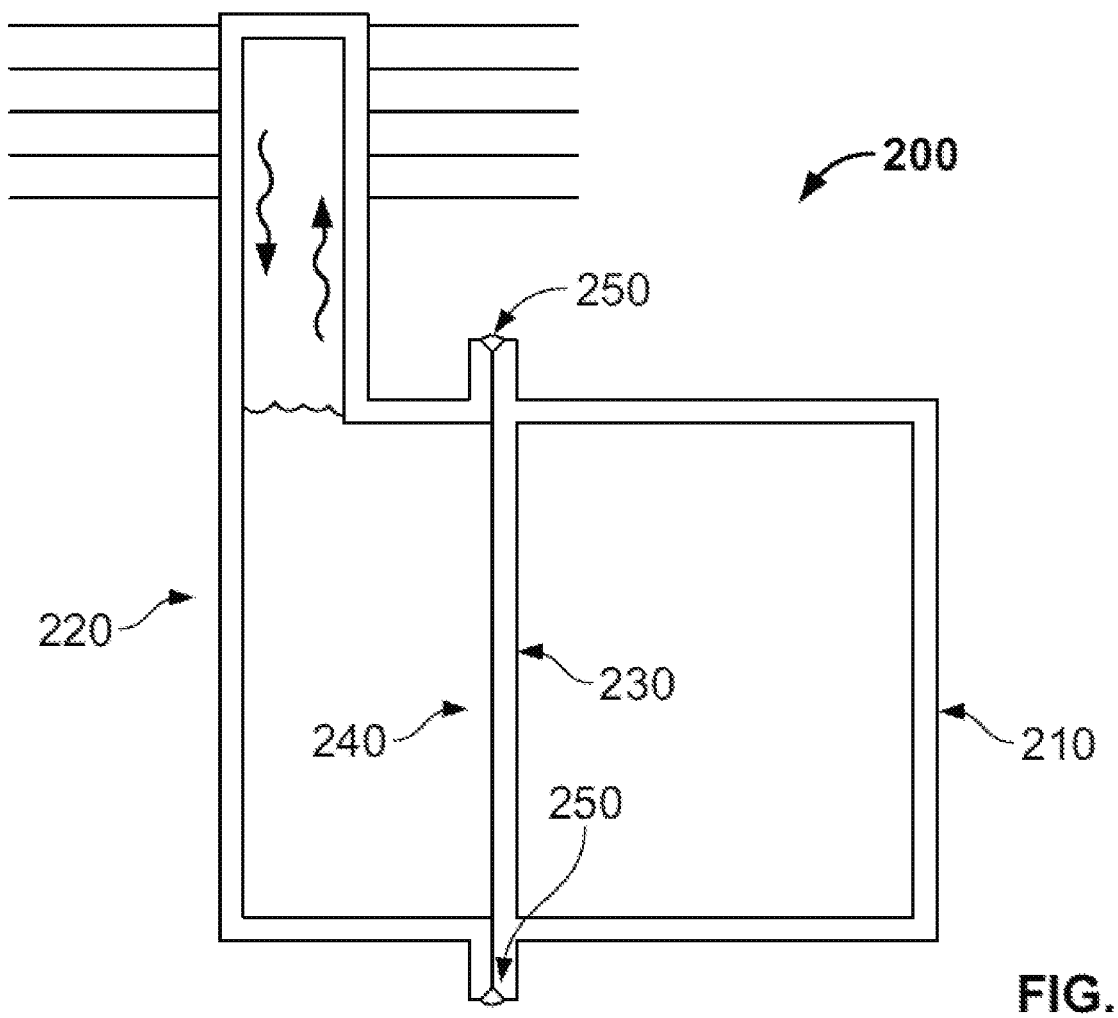
FIG. 2 is an alternative embodiment of a thermal siphon welded to a tank.

FIG. 2 depicts another embodiment of a heat management system 200. The heat management system 200 is substantially the same as the heat management system 100 of FIG. 1 described above (including the alternative embodiments discussed), except for the differences described herein. The heat management system 200 includes a tank 210 and a thermal siphon 220 that function similarly to the heat management system of FIG. 1. In the FIG. 2 embodiment, however, the tank 210 is fully enclosed and includes a conductive wall 230 that is similar to the conductive wall 120 of the thermal siphon 110 of the FIG. 1 embodiment. The thermal siphon 220 includes an opening 240 adjacent to the conductive wall 230. Opening 240 is similar to opening 115 of the embodiment of FIG. 1, except that it is located on the thermal siphon 220. The tank 210 and thermal siphon 220 in this embodiment are fixed and sealed to each other via a weld 250. In alternative embodiments (not shown), the weld can be replaced by brazing or other permanent attachment process. In alternative embodiments (not shown), the bolts and gaskets used in the FIG. 1 embodiment can be used. In all other respects, the heat management system 200 is identical to the heat management system 100 described above.

Figure 3:
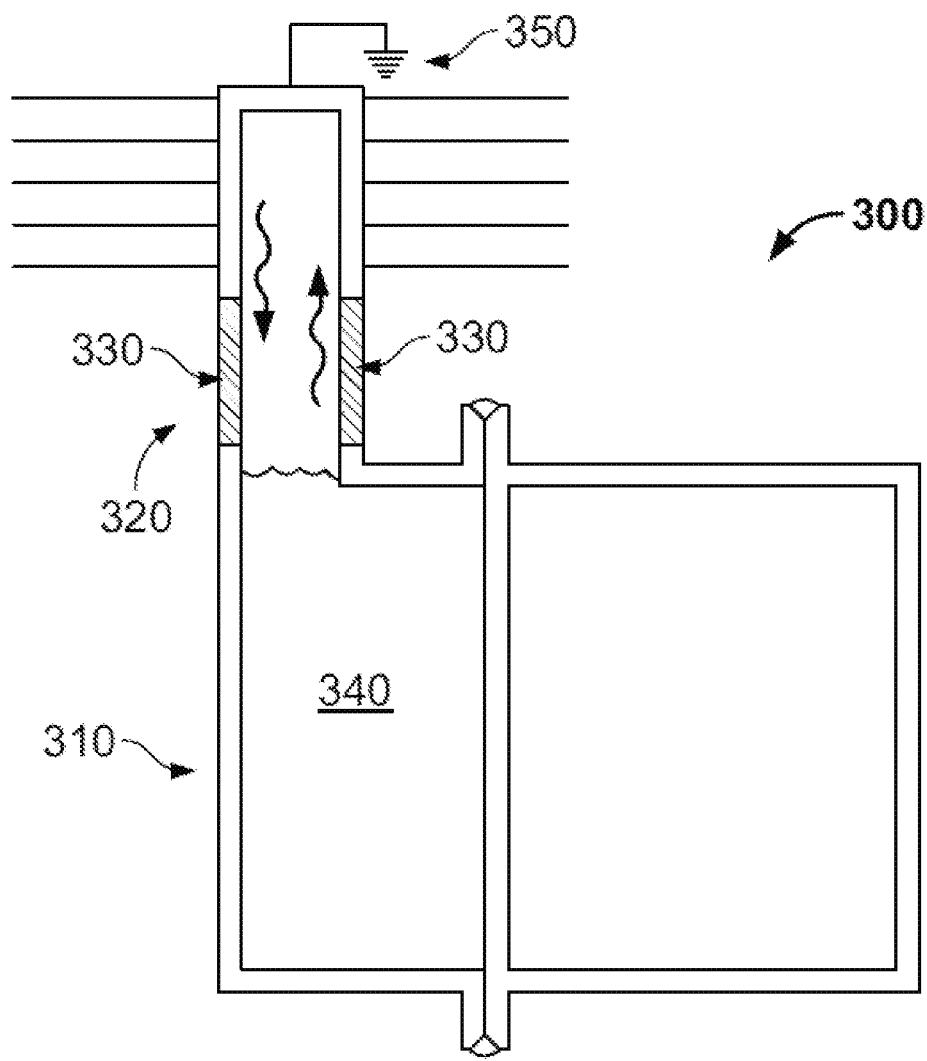
FIG. 3 is another alternative embodiment of a thermal siphon having insulating material and fluid.

FIG. 3 shows another embodiment of a heat management system 300 that is substantially the same as heat management system 200 (including the alternative embodiments discussed), except for the differences described herein. In the illustrated embodiment, heat management system 300 includes a thermal siphon 310 that includes a cooling portion 320 having electrically insulated walls 330. These walls could be manufactured from epoxy, ceramic, or a similar material. Fluid 340 located in thermal siphon is a dielectric liquid in this embodiment, to prevent electrical conduction. Cooling portion 320 is further grounded at 350 in this embodiment, to increase safety by preventing a voltage increase on the cooling portion. The embodiment of FIG. 3 is designed to prevent electrical conduction in an application where the contents of tank may cause an arc or fail shorted to the tank walls. Otherwise, the heat management system 300 is functionally similar to the heat management system 200 or heat management system 100.

Figure 4:
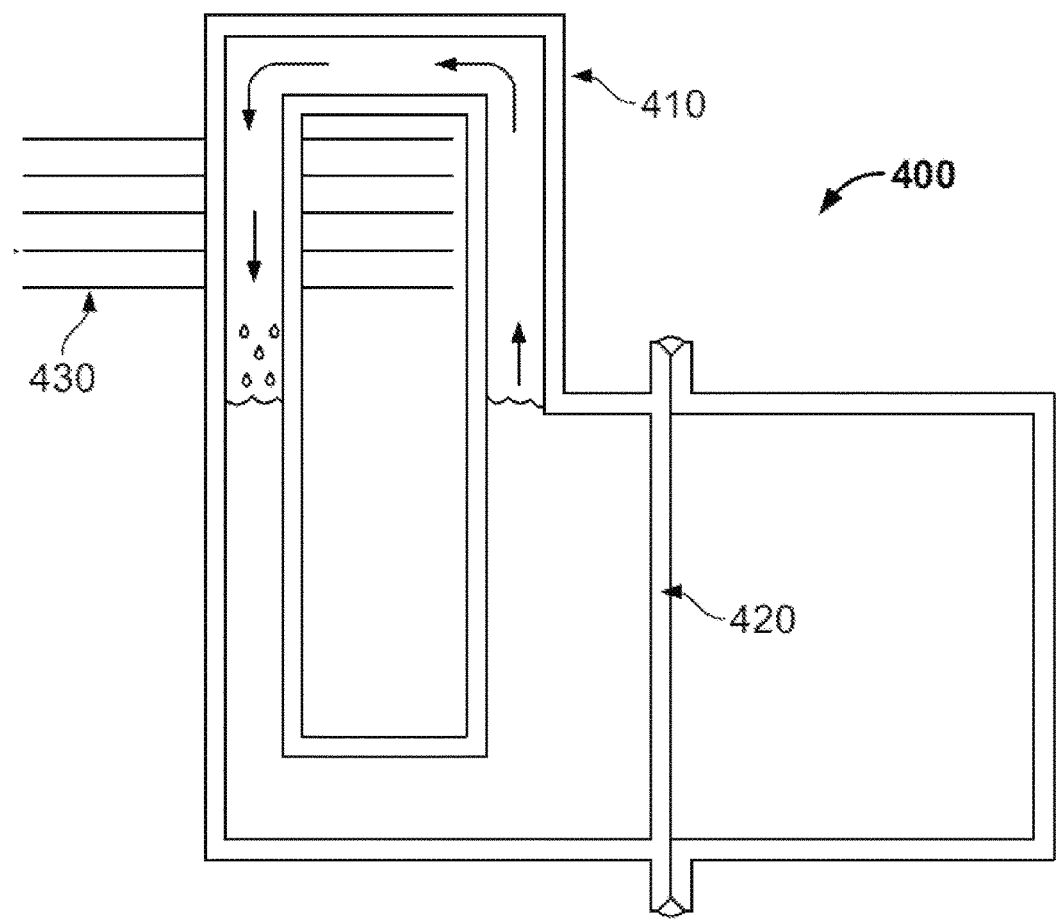
FIG. 4 is yet another alternative embodiment of a thermal siphon having a loop.

FIG. 4 shows another embodiment of a heat management system 400, having a thermal siphon 410 shaped as a loop.

Thermal siphon 410 is substantially similar in function to the thermal siphons discussed in other embodiments, except for the differences described below. In this embodiment, the liquid inside of thermal siphon 410 is vaporized in proximity to conductive wall 420, and passes upwards and around the loop portion of thermal siphon, where the heat is transferred to cooling fins 430. The vaporized liquid then condenses towards the end of the loop portion, and falls back down into the main body of thermal siphon 400. The center of the loop portion of thermal siphon 410 is exposed to the environment, and can include cooling fins 430 on an exterior surface thereof. In other alternative embodiments (not shown), portions of the loop could be made of electrically insulating material and can be used with dielectric fluid. In an embodiment where a portion of the loop is made of an electrically insulating material, the cooling section will be grounded.

Figure 5:
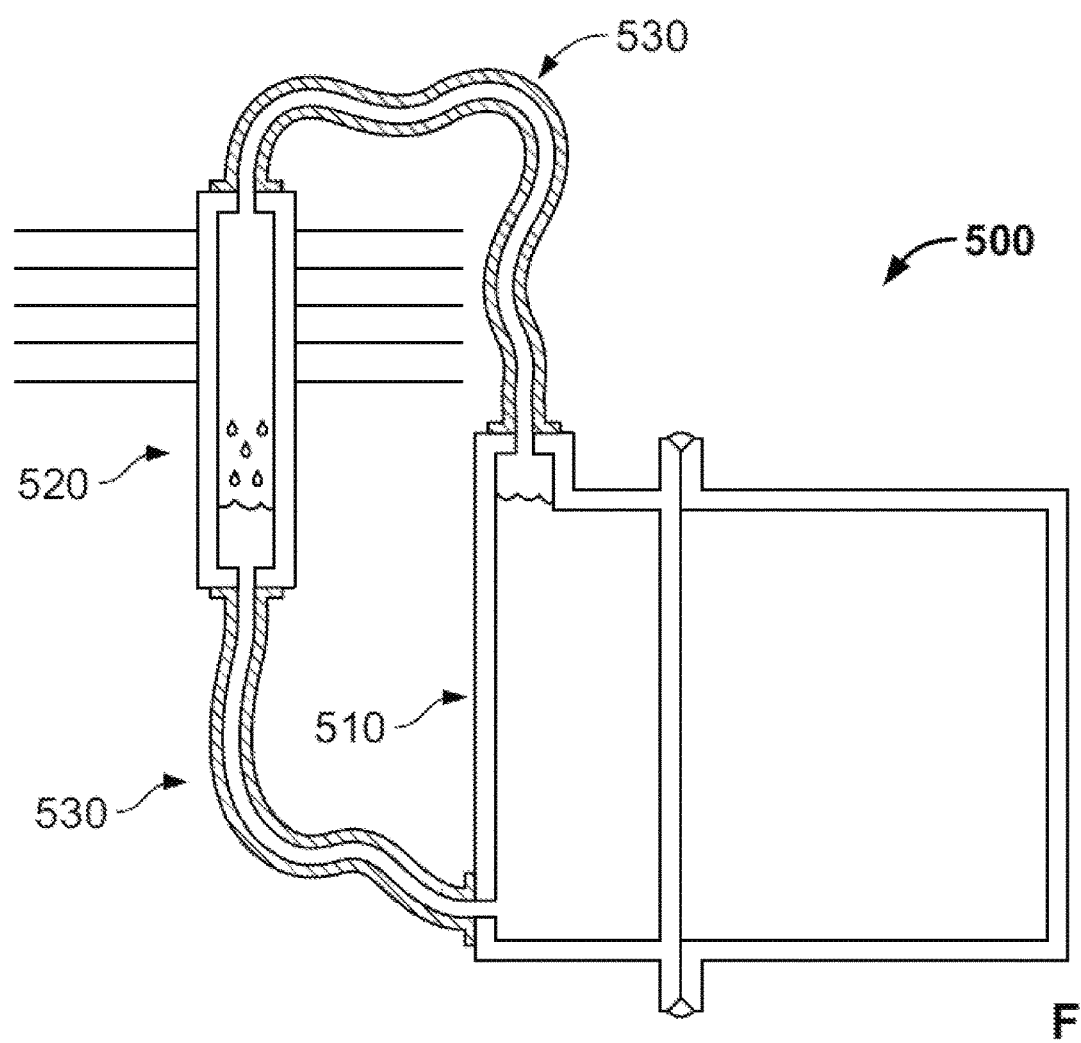
FIG. 5 is still another alternative embodiment of a thermal siphon having a loop and hose.

FIG. 5 shows another embodiment of a heat management system 500, having a thermal siphon main body 510 and a cooling portion 520 separate from the thermal siphon main body 510, and connected via one or more hoses 530. Cooling portion 520 is distal from the main thermal siphon main body 510 and tank. Heat management system 500 is similar to heat management system 400 of FIG. 4, except for the addition of hoses 530 that are used to guide vaporized liquid from the thermal siphon main body 510 to the cooling portion 520 and to guide condensed liquid from the cooling portion 520 to the thermal siphon main body 510. Cooling portion 520 in this embodiment has a rectangular cross section, but may take any other shape in alternative embodiments, such as a circle or a trapezoid. In other alternative embodiments (not shown), the hoses can be made of an electrically insulating material as well, and can be used with dielectric fluid. The cooling portion would be grounded in an embodiment where the hose is made of an electrically insulating material.

Figure 6:
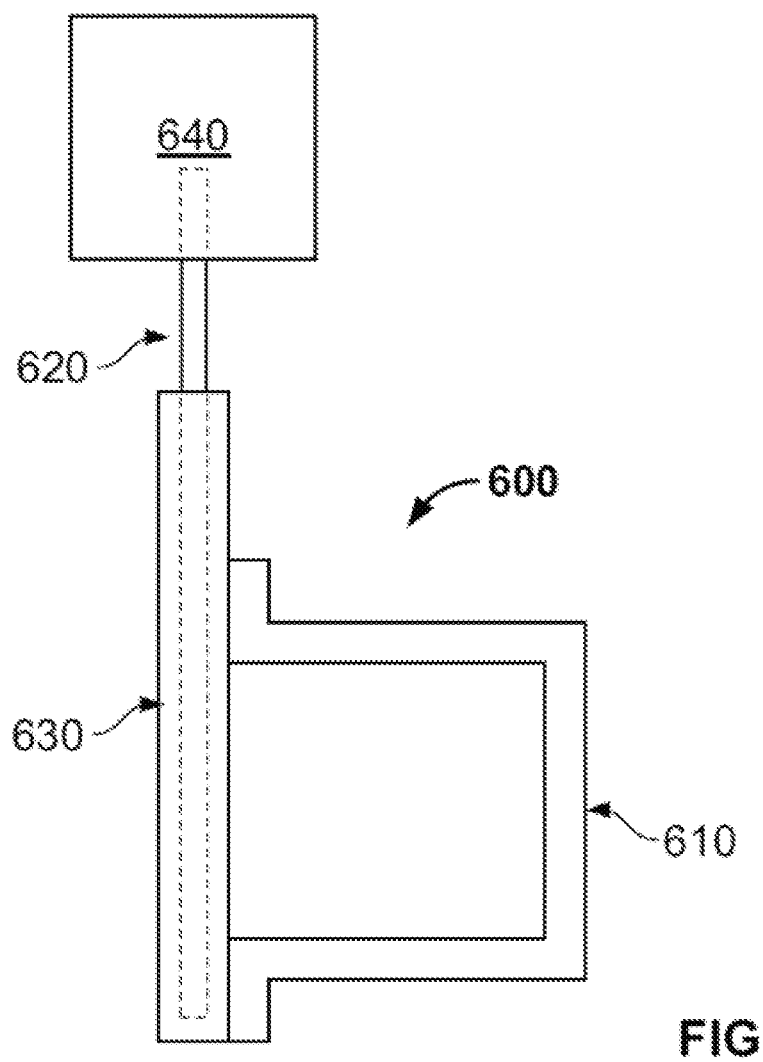
FIG. 6 is one embodiment of a heat pipe fixed to a tank.

FIG. 6 depicts an alternative heat management system 600 having a tank 610 and a heat pipe 620 located within a plate 630 affixed to the tank 610. The heat pipe 620 is connected to a fin stack 640, which contains one or more fins (not shown), similar to the fins discussed in the embodiments listed above. Tank 610 in this embodiment includes an opening adjacent to the plate 630. The plate 630 is fixed to the tank using the same means as discussed above with respect to the other embodiments—namely a bolt/gasket arrangement or a weld, for example. When the plate 630 is fixed to the tank 610, the tank 610 is sealed. The plate 630 is made from a conductive metal, such as ceramic or metal, and transfers heat from the inside of tank 610 to heat pipe 620. Heat pipe 620 is a closed system, and is embedded within plate 630, and can be made from a conductive material such as copper or other metal. Heat pipe 620 extends above plate 630 where it connects to fin stack 640 and is configured to transfer heat to individual fins in the fin stack. While a single heat pipe 620 is shown, in other alternative embodiments (not shown), multiple heat pipes can be embedded within a single plate, and can connect to a single or multiple fin stacks.

In this embodiment, the heat pipe 620 contains a liquid film inside the pipe. Liquid film is vaporized via heat conducted through plate 630 from tank 610. The vapor rises into the fin stack 640, where it transfers heat to the fins, and then condenses and falls back down the heat pipe 620. The fins dissipate heat in the same way as described above with the previous embodiments.

Figure 7:
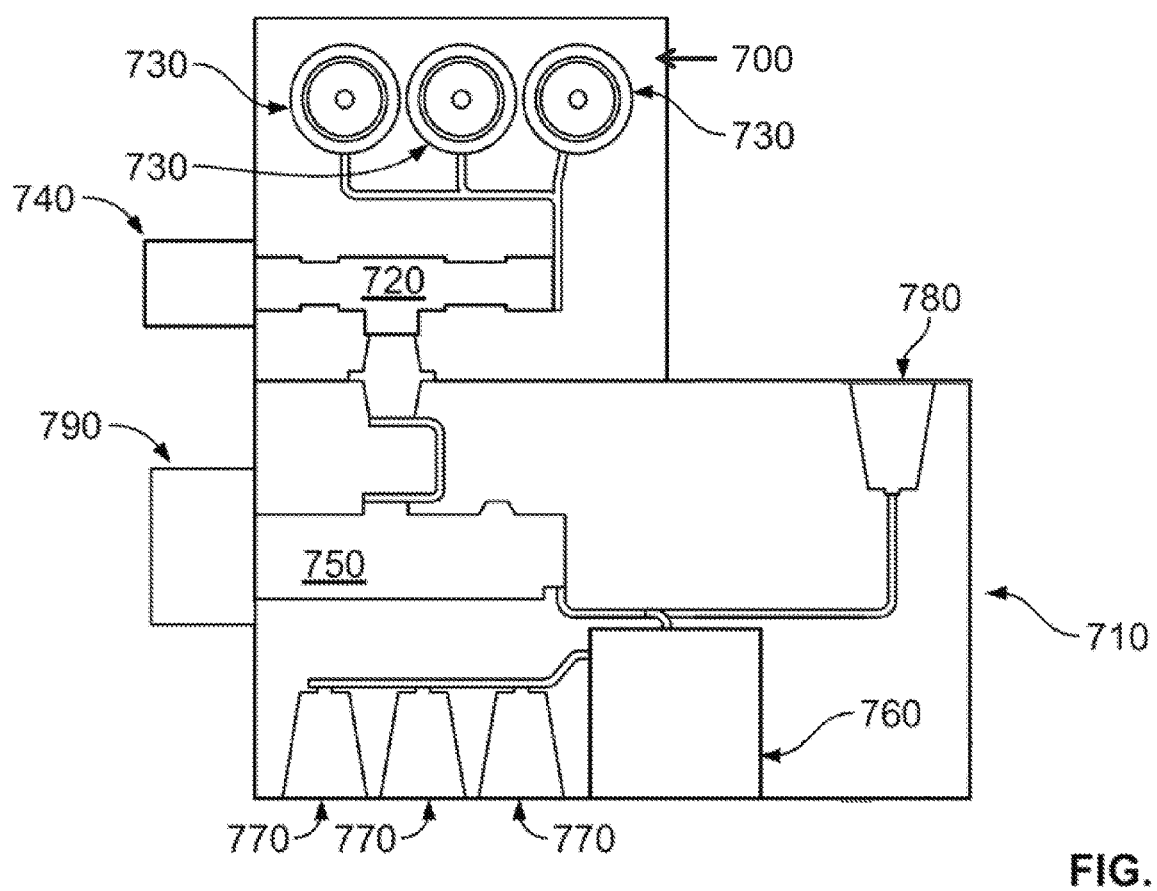
FIG. 7 shows the contents of two tanks according to any embodiment of the present disclosure.

FIG. 7 shows an example of contents that can be included in tanks 700 and 710, which can be any of the tanks described in FIGS. 1-6. The contents of tanks 700 and 710 are used to regulate and distribute electrical power from a power source to downstream equipment, for example machinery in a factory. The power source is typically delivered as three phase power. The electrical equipment inside of tanks 700, 710 generate heat and is insulated with an electrically insulating gas that allows the electrical equipment to be placed closer together within the tank as compared to a tank filled with air. Tank 700 includes a three-position disconnector 720, busbar connectors 730, and a three-position disconnector operating mechanism 740 that is located on an external side of tank 700. Further, tank 700 is airtight and sealed with an inert gas. Busbar connectors 730 are used to connect one section of medium voltage switchgear to an adjacent section of medium voltage switchgear, or other medium voltage power distribution equipment. The three-position disconnector 720 is used to connect, disconnect, or ground all three phases of busbar from the circuit breaker 750 to the connectors 730. A user can control the three-position disconnector 720 with the three-position disconnector operating mechanism 740.

Tank 710 contains a circuit breaker 750, a current transformer 760, cable bushings 770 and a VT bushing 780. Tank 710 is airtight and filled with an inert gas. The circuit breaker 750 can be controlled with a circuit-breaker operating mechanism 790 located on an external side of tank 710. Circuit breaker 750 is electrically and operatively connected to three-position disconnector 720 of tank 700, and passes power from the three-position disconnector 720 through the current transformer 760 to the cable bushings 770. The VT bushings 780 are also connected via busbar to the circuit breaker 750. The cable bushings 770 can be connected either to a three-phase power source or to a three-phase load.

Other arrangements of the above components can be used in alternative embodiments (not shown), which include greater or fewer numbers of each component. In other alternative embodiments (not shown), other types or of equipment can be installed in tanks 700, 710. In other alternative embodiments (not shown), tanks 700 and 710 can be combined into a single tank that houses all of the components disclosed above. In other alternative embodiments (not shown), the three-position disconnector could be replaced with a different type of disconnector switch, such as a load break switch, a non-load break switch, or an earthing switch.

Figure 8:
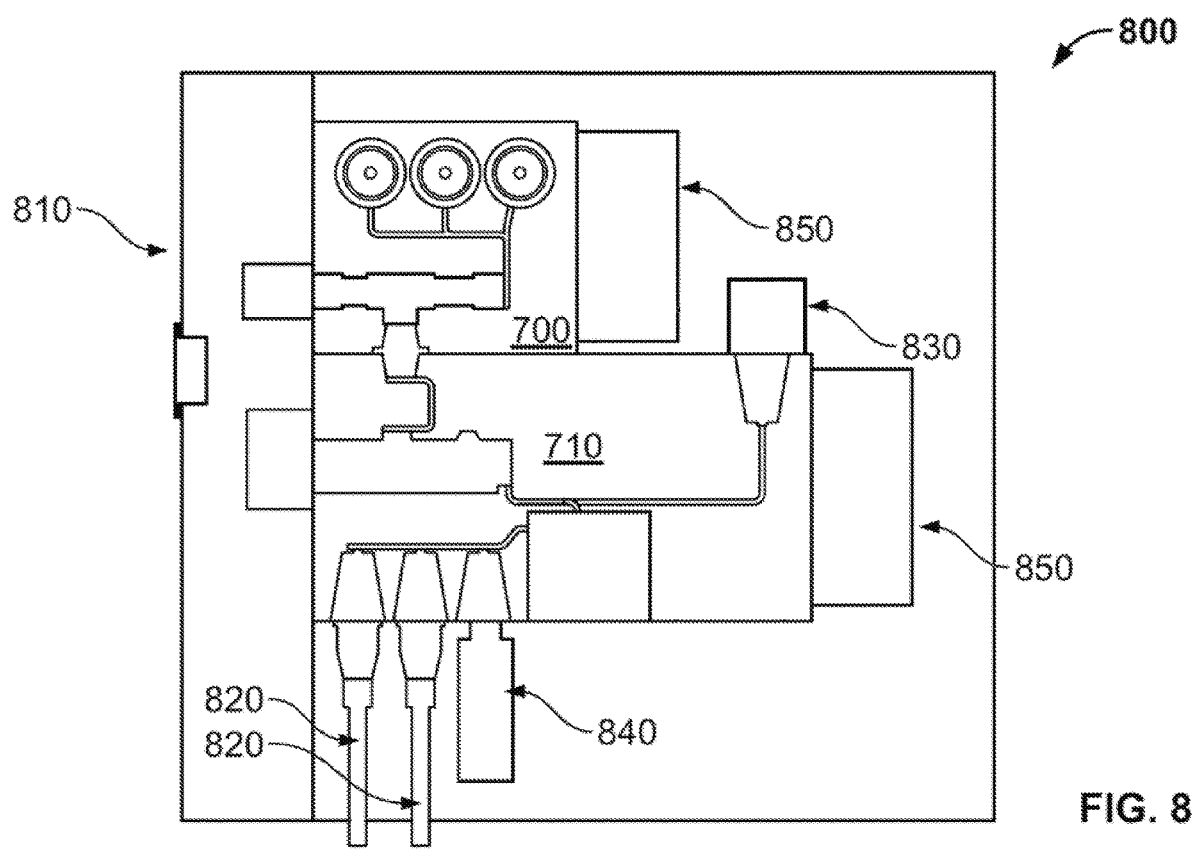
FIG. 8 shows two tanks and corresponding thermal siphons according to any embodiment of the present disclosure, installed as part of a gas-insulated medium voltage switchgear assembly.

FIG. 8 illustrates how tanks 700, 710 would be mounted in or made part of an exemplary gas-insulated medium voltage switchgear assembly 800 (or "Switchgear Assembly"). Switchgear Assembly 800 includes a door 810 and receives cables 820 that are connected to downstream equipment. Switchgear Assembly 800 further includes pluggable voltage transformer ("VT") 830, a surge arrestor 840, and thermal siphons 850. Thermal siphons 850 are shown here as generic blocks not drawn to scale, to illustrate possible locations for attachment to the tanks 700, 710. Thermal siphons 850 can take the form of any of the embodiments disclosed above and can be connected to tanks 700, 710 according to any of the embodiments disclosed above. Thermal siphons 850 can alternatively be heat pipes according to the embodiment of FIG. 6. Door 810 allows a user to open and close the compartment of Switchgear Assembly 800 in which the three-position disconnector operating mechanism 740 and circuit-breaker operating mechanism 790 are located, to access the operating mechanisms. Cables 820 are electrically connected to one or more of the cable bushings 770, and can carry power to downstream equipment. Surge arrestor 840 is electrically connected to one of the cable bushings 770, and prevents power surges from traveling down cables 820 to the downstream equipment. The pluggable VT 830 is used to measure the busbar voltage on the cable side of the circuit breaker, in this instance. Pluggable VT 830 can also be plugged into the main bus tank 700 to measure the main busbar voltage in other instance (not shown). Thermal siphons 850 are affixed to the tanks 700, 710 according to the embodiments disclosed in FIGS. 1-6, and aid in transferring heat from the tanks to the atmosphere.

In alternative embodiments (not shown), other arrangements of equipment may be installed in a housing without departing from the scope of the present disclosure. For example, any number of cable bushings or transformers may be used in a single housing.

In alternative embodiments (not shown), gas-insulated tank assemblies can be manufactured and sold separately from the gas-insulated medium voltage switchgear assemblies. In such embodiments, the gas-insulated tank would contain electrical equipment, such as a three-position switch or a circuit breaker, and would be permanently connected to a thermal siphon or a heat pipe. These can be referred to as a gas-insulated three-position switch tank assembly or a gas-insulated circuit breaker tank assembly, respectively.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A tank assembly having heat-generating equipment contained therein, comprising: a thermal siphon having an opening, wherein the thermal siphon contains a liquid and a gas, and wherein the thermal siphon has a cooling portion; and a first closed tank and a second closed tank, wherein the first closed tank or the second closed tank is fixed to the thermal siphon such that a side of the first closed tank or the second closed tank seals the opening of the thermal siphon, wherein the first closed tank houses a disconnector switch, and wherein the second closed tank houses a circuit breaker operatively connected to the disconnector switch.

2. The tank assembly of claim 1, wherein the tank assembly is part of a gas-insulated medium voltage switchgear assembly.

3. The tank assembly of claim 1, wherein the thermal siphon and the first or second closed tank are welded or brazed together.

4. The tank assembly of claim 1, wherein the thermal siphon and the first or second closed tank are bolted together, and sealed with a gasket.

5. The tank assembly of claim 1, wherein the thermal siphon forms a closed loop.

6. The tank assembly of claim 5, further including at least one hose attached to the cooling portion.

7. A tank assembly having heat-generating equipment contained therein, comprising: a thermal siphon having an opening, wherein an interior of the thermal siphon contains a liquid and a gas; and a tank fixed to the thermal siphon and sealing the opening of the thermal siphon, wherein the tank houses at least one of a disconnector switch and a circuit breaker, wherein the sealing of the opening of the thermal siphon prevents the liquid and the gas from entering the tank, wherein the thermal siphon extends beyond a side of the tank, and wherein the thermal siphon has a cooling portion.

8. The tank assembly of claim 7, further including a plurality of thermal siphons located adjacent to the tank.

9. The tank assembly of claim 7, further including a fin stack fixed to the thermal siphon, wherein the fin stack includes fins extending from the thermal siphon.

10. The tank assembly of claim 9, wherein the fin stack is configured to dissipate heat to an airflow passing between fins of the fin stack.

11. The tank assembly of claim 7, further comprising a second tank, wherein the second tank houses at least one of the disconnector switch and the circuit breaker.

12. A tank assembly having heat-generating equipment contained therein, comprising: a thermal siphon having an opening, wherein an interior of the thermal siphon contains a liquid and a gas; and a first tank fixed to the thermal siphon and sealing the opening of the thermal siphon, wherein the first tank houses at least one of a disconnector switch and a circuit breaker, wherein the sealing of the opening of the thermal siphon prevents the liquid and the gas from entering the first tank, wherein the thermal siphon has a cooling portion that includes electrically insulated walls.

13. The tank assembly of claim 12, further comprising a fin stack fixed to the cooling portion of the thermal siphon.

14. The tank assembly of claim 12, wherein the first tank includes a flange bolted to the thermal siphon.

15. The tank assembly of claim 12, wherein the thermal siphon is embedded in a plate that is fixed to the first tank.

16. The tank assembly of claim 15, further comprising a second thermal siphon embedded in the plate.

17. The tank assembly of claim 12, wherein the liquid is a dielectric liquid.

18. The tank assembly of claim 12, wherein the first tank houses a disconnector switch.

19. The tank assembly of claim 12, wherein the first tank houses a disconnector switch.

20. The tank assembly of claim 12, further comprising a second tank wherein the first tank houses a disconnector switch and wherein the second tank houses a circuit breaker operatively connected to the disconnector switch.

* * * * *